United States Patent
Kim

(10) Patent No.: US 11,483,125 B2
(45) Date of Patent: Oct. 25, 2022

(54) CLOCK AND DATA RECOVERY CIRCUIT AND RECEIVER

(71) Applicant: MegaChips Corporation, Osaka (JP)

(72) Inventor: Yongwi Kim, Chiba (JP)

(73) Assignee: MEGACHIPS CORPORATION, Osaka (JP)

( * ) Notice: Subject to any disclaimer, the term of this patent is extended or adjusted under 35 U.S.C. 154(b) by 0 days.

(21) Appl. No.: 17/517,845

(22) Filed: Nov. 3, 2021

(65) Prior Publication Data

US 2022/0150043 A1 May 12, 2022

(30) Foreign Application Priority Data

Nov. 6, 2020 (JP) .............................. JP2020-185514

(51) Int. Cl.
*H04L 7/00* (2006.01)
*H03L 7/08* (2006.01)
*H03L 7/093* (2006.01)

(52) U.S. Cl.
CPC .............. *H04L 7/0016* (2013.01); *H03L 7/08* (2013.01); *H03L 7/093* (2013.01); *H04L 7/0025* (2013.01)

(58) Field of Classification Search
CPC ....... H04L 7/02; H04L 7/0337; H04L 7/0016; H04L 7/0025; H03L 7/00; H03L 7/06; H03L 7/08; H03L 7/085; H03L 7/093
See application file for complete search history.

(56) References Cited

U.S. PATENT DOCUMENTS

| 7,489,749 | B2  |  2/2009 | Liu |
|-----------|-----|---------|-----|
| 8,036,300 | B2* | 10/2011 | Evans ............... H04L 7/0337 |
|           |     |         | 375/372 |
| 8,130,888 | B2  |  3/2012 | Eldredge et al. |
| 8,693,596 | B1  |  4/2014 | Warner et al. |
| 8,942,334 | B1  |  1/2015 | Zortea et al. |
| 8,989,333 | B2  |  3/2015 | Hashida et al. |

(Continued)

FOREIGN PATENT DOCUMENTS

JP 2020-120214 A 8/2020

OTHER PUBLICATIONS

Walker, "Clock and Data Recovery for Serial Digital Communication, Focusing on Bangbang Loop CDR Design Methodology ISSCC Short Course", Feb. 2002, pp. 1-79.

(Continued)

*Primary Examiner* — Betsy Deppe
(74) *Attorney, Agent, or Firm* — Xsensus LLP

(57) ABSTRACT

A clock and data recovery circuit includes a phase interpolation circuit that adjusts a phase of a reference clock signal generated by a reference clock generation circuit to generate a reception clock signal, a filter that performs filter processing on a data signal output from an ADC that converts an analog data signal to a digital data signal in synchronization with the clock signal, a phase comparison circuit that outputs phase difference data between a transmission-side clock signal and the reference clock signal based on an output of the filter, and a loop filter that generates phase data to be set in the phase interpolation circuit. The filter includes an FIR filter with a tap number N, and an FIR filter with a tap number N+1 that outputs a signal delayed by half a clock than the former FIR filter.

5 Claims, 6 Drawing Sheets

(56) References Cited

U.S. PATENT DOCUMENTS

| | | | |
|---|---|---|---|
| 9,001,953 B2* | 4/2015 | Katoh | H03K 5/135 |
| | | | 375/371 |
| 2009/0225917 A1* | 9/2009 | Takagi | H04L 7/0337 |
| | | | 375/359 |
| 2013/0243107 A1 | 9/2013 | Chmelar et al. | |

OTHER PUBLICATIONS

Sommer, "Timing Recovery of PAM Signals Using Baud Rate Interpolation" Available Online at: https://ieeexplore.ieee.org/document/1399690, Proceedings of the 11th IEEE International Conference on Electronics, Circuits and Systems (ICECS), Dec. 15, 2004, 1 page.

Palermo, "ECEN689: Special Topics in High-Speed Links Circuits and Systems Spring 2010", Lecture 30: CDRS, 2010, pp. 1-21.

\* cited by examiner

CLOCK AND DATA RECOVERY CIRCUIT AND RECEIVER

CROSS-REFERENCE TO RELATED APPLICATION

This application claims priority to Japanese Application No. 2020-185514, filed Nov. 6, 2020, the entire contents of which are incorporated herein by reference.

BACKGROUND

Technical Field

The present invention relates to a circuit that recovers a clock signal for sampling received data and a receiver including the circuit.

Description of Related Art

In a communication system, it is necessary to establish synchronization in frequencies and phases of clock signals between a transmitter and a receiver. A clock and data recovery circuit (CDR circuit) included in the receiver recovers a clock signal based on a random data signal transmitted from the transmitter. An analog-to-digital converter included in the receiver samples a data signal based on the clock signal recovered by the CDR circuit.

A clock recovery circuit of JP 2020-120214 A calculates a phase difference between input data and a recovery clock using a clock signal and a clock signal that is inverted by 180 degrees from the clock signal. In addition, a method of calculating a phase difference between a transmitter-side clock signal and a receiver-side clock signal using a double oversampled clock signal is proposed.

SUMMARY

However, a higher manufacturing cost is required to configure an analog circuit that calculates the phase difference between the transmitter-side clock signal and the receiver-side clock signal using the double oversampled clock signal or the clock signal whose phase is inverted by 180 degrees. Thus, it is desired to calculate the phase difference of clock signals with respect to a digital converted data signal. As such, it is necessary to increase a sample rate of the analog-to-digital converter. Such a configuration requires a higher manufacturing cost and may be unlikely to be implemented depending on conditions such as costs and product specifications.

An object of the present invention is to recover a clock signal based on a received data signal without need for a high-speed analog-to-digital converter.

A clock and data recovery circuit according to one aspect of the present invention includes a phase interpolation circuit that adjusts a phase of a reference clock signal generated by a reference clock generation circuit to generate a reception clock signal, a filter that inputs a reception digital data signal output from an analog-to-digital converter that operates in synchronization with the reception clock signal generated in the phase interpolation circuit to convert a reception analog data signal to the reception digital data signal, to perform filter processing on the reception digital data signal, a phase comparison circuit that outputs phase difference data between a transmission-side clock signal and the reference clock signal based on a signal output from the filter, and a loop filter that generates phase data to be set in the phase interpolation circuit based on the phase difference data output from the phase comparison circuit, wherein the filter includes a first FIR filter with a tap number N, and a second FIR filter with a tap number N+1 that outputs a signal delayed by half a clock than the first FIR filter.

A receiver according to another aspect of the present invention includes the clock and data recovery circuit, the reference clock generation circuit, and the analog-to-digital converter as described above.

Other features, elements, characteristics, and advantages of the present disclosure will become more apparent from the following description of preferred embodiments of the present disclosure with reference to the attached drawings.

DETAILED DESCRIPTION

A clock and data recovery circuit according to embodiments of the present invention will now be described with reference to the attached drawing.

(1) Configuration of Communication System

Figure 1:
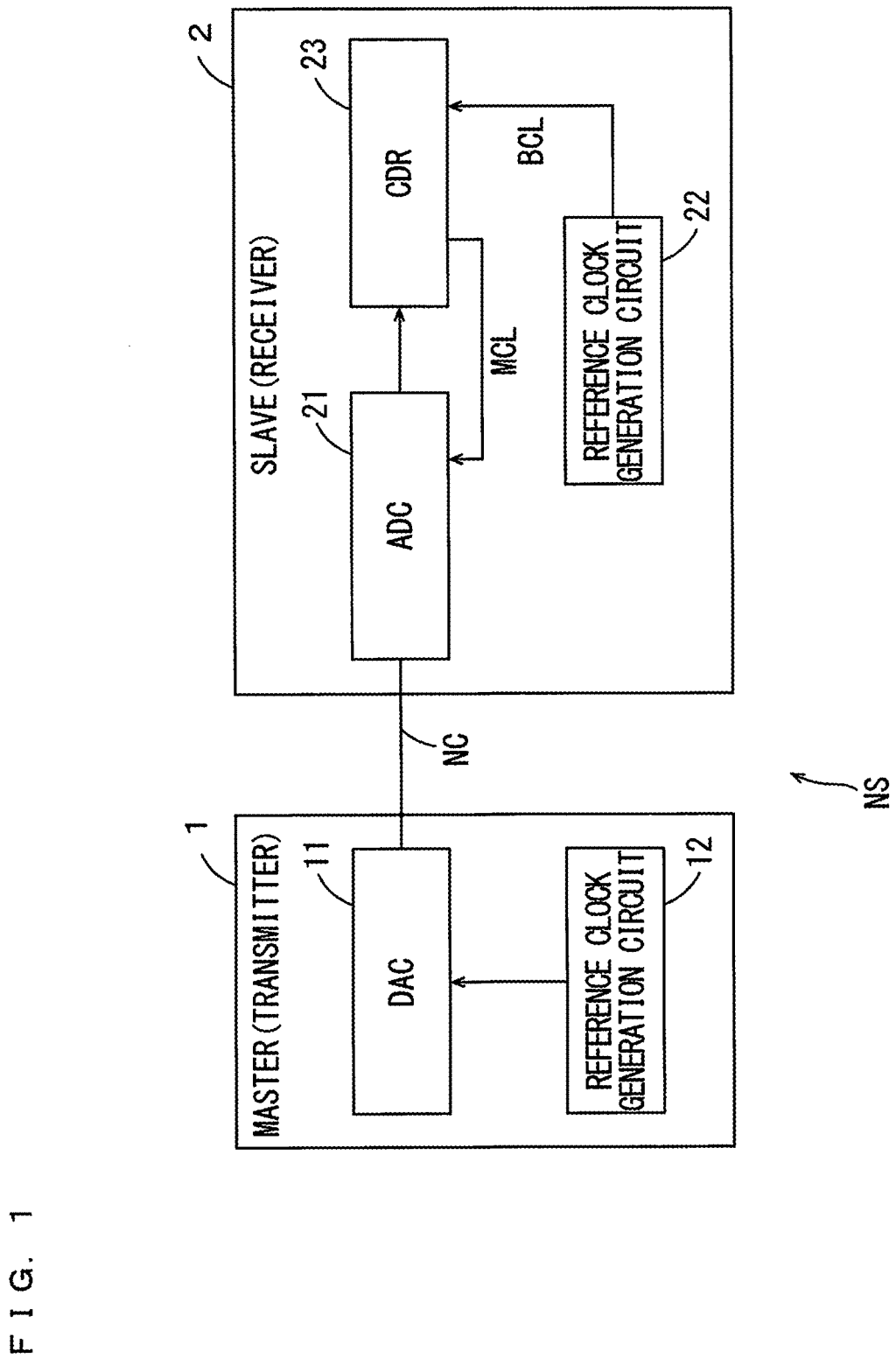
FIG. 1 is an overall view of a communication system.

FIG. 1 is an overall view of a communication system NS. The communication system NS includes a master 1 and a slave 2. The master 1 and the slave 2 are connected through a communication line NC. That is, in this embodiment, the master 1 and the slave 2 carry out high speed wired communication. The master 1 and the slave 2 may be installed in the same facility or may be installed in different facilities. Alternatively, the master 1 and the slave 2 may be installed in a vehicle such as an automobile. The master 1 and the slave 2 carry out communication utilizing TCP/IP, for example. In this embodiment, description is made on a case where the master 1 operates as a transmitter and the slave 2 operates as a receiver as an example. Therefore, the master 1 as a transmitter 1 and the slave 2 as a receiver 2 will be described below. It is noted that each apparatus (each terminal) may include functions as the master 1 and the slave 2 which will be described in the embodiment provided below.

The transmitter 1 includes a digital-to-analog converter (DAC) 11 and a reference clock generation circuit 12. The digital-to-analog converter 11 converts a data signal to be transmitted into an analog signal based on a reference clock signal generated by the reference clock generation circuit 12, to output the analog converted data signal to the communication line NC. The reference clock generation circuit 12 is constituted by, for example, a crystal oscillator, a PLL (Phase Lock Loop) circuit, etc. The reference clock signal generated by the reference clock generation circuit 12 is an example of a "transmission-side clock signal" in the present invention.

The receiver 2 includes an analog-to-digital converter (ADC) 21, a reference clock generation circuit 22, and a clock and data recovery circuit (CDR circuit) 23. The analog-to-digital converter 21 digitally converts the data signal received through the communication line NC utilizing a reception clock signal MCL generated in the clock and data recovery circuit 23. The reference clock generation circuit 22 is constituted by, for example, a crystal oscillator, a PLL (Phase Lock Loop) circuit, etc. and generates a reference clock signal BCL. The clock and data recovery circuit 23 adjusts a phase of the reference clock signal BCL based on the digital converted data signal to generate the reception clock signal MCL.

(2) Configuration of Receiver Including Clock and Data Recovery Circuit

Figure 2:
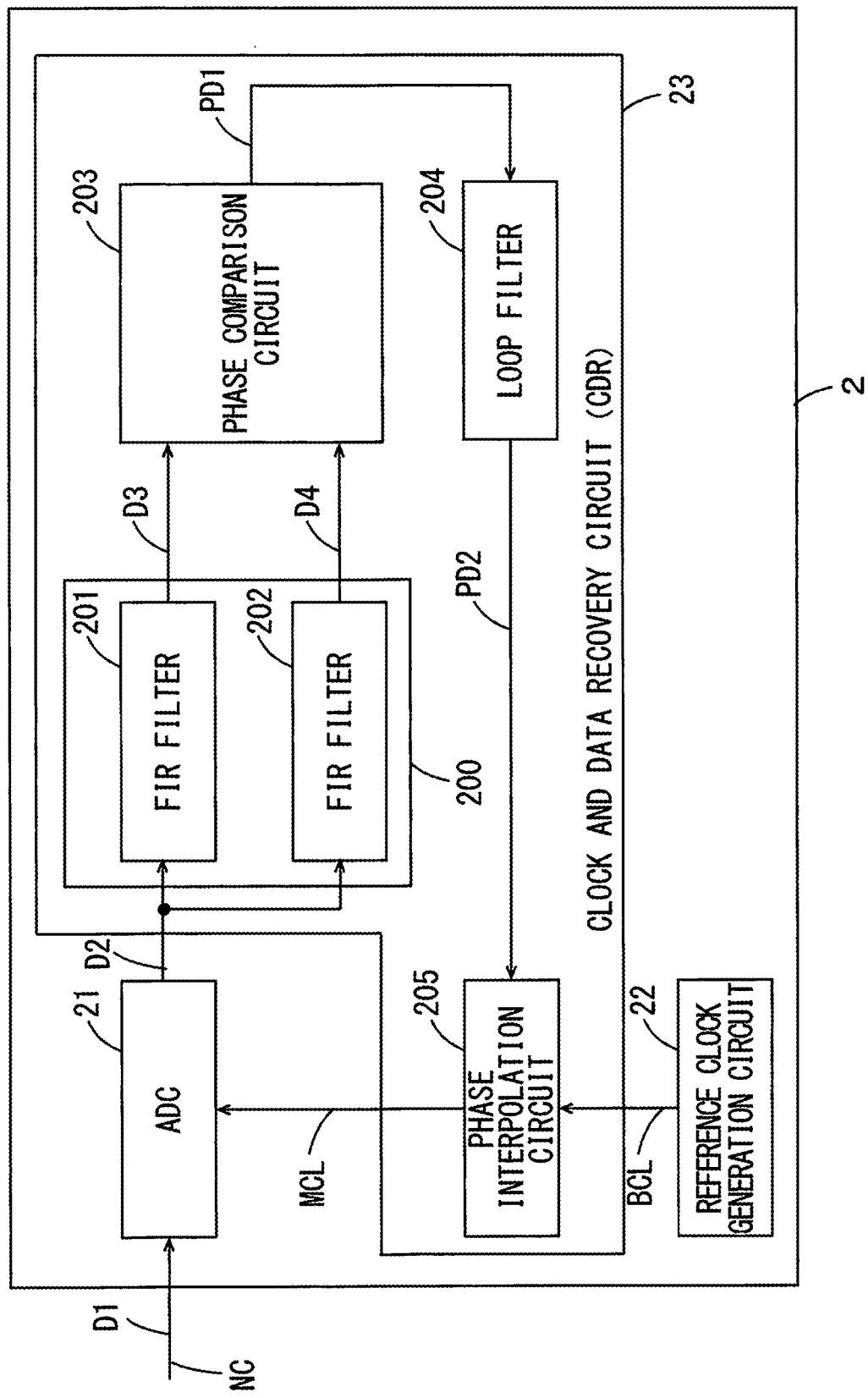
FIG. 2 is a block diagram of a receiver showing an internal configuration of a clock and data recovery circuit according to this embodiment.

FIG. 2 is a block diagram of the receiver 2 showing an internal configuration of the clock and data recovery circuit 23. The receiver 2 includes the analog-to-digital converter 21, the reference clock generation circuit 22, and the clock and data recovery circuit 23 as shown in FIG. 1.

The analog-to-digital converter 21 converts an analog data signal D1 received through the communication line NC into a digital data signal D2. The analog-to-digital converter 21 samples the data signal D2 based on the reception clock signal MCL generated by a phase interpolation circuit 205. The reference clock generation circuit 22 generates the reference clock signal BCL. The phase interpolation circuit 205 inputs the reference clock signal BCL output from the reference clock generation circuit 22. The phase interpolation circuit 205 adjusts the phase of the reference clock signal BCL based on phase data PD2 generated by the clock and data recovery circuit 23, to generate the reception clock signal MCL.

The clock and data recovery circuit 23 includes a filter 200, a phase comparison circuit 203, a loop filter 204, and the phase interpolation circuit 205 as shown in FIG. 2. The filter 200 includes an FIR filter 201 and an FIR filter 202. The FIR filters 201 and 202 each input the digital data signal D2 and respectively output data signals D3 and D4 subjected to filter processing. The data signal D4 is a signal delayed by half a clock than the data signal D3. The configurations of the FIR filters 201, 202 will be described below in detail. The FIR filter 201 is an example of a "first FIR filter" of the present invention, and the FIR filter 202 is an example of a "second FIR filter" of the present invention.

The phase comparison circuit 203 inputs the data signal D3 and the data signal D4 output by the filter 200. The phase comparison circuit 203 calculates phase difference data PD1 between the reference clock signal generated by the reference clock generation circuit 12 of the transmitter 1 and the reference clock signal BCL generated by the reference clock generation circuit 22 of the receiver 2 using the data signals D3, D4. A configuration of the phase comparison circuit 203 will be described below in detail.

The loop filter 204 includes an averaging circuit and an integrating circuit. The loop filter 204 inputs the phase difference data PD1 calculated in the phase comparison circuit 203. The loop filter 204 performs averaging processing on the phase difference data PD1 in the averaging circuit. The loop filter 204 integrates the phase difference data PD1 subjected to the averaging processing in the integrating circuit, to calculate phase data PD2. The loop filter 204 applies the phase data PD2 to the phase interpolation circuit 205.

The phase interpolation circuit 205 inputs the phase data PD2 output from the loop filter 204. The phase interpolation circuit 205 adjusts the phase of the reference clock signal BCL based on the phase data PD2 to generate the reception clock signal MCL. The phase interpolation circuit 205 applies the reception clock signal MCL to the analog-to-digital converter 21.

(3) Circuit Configuration of FIR Filter

Figure 3:
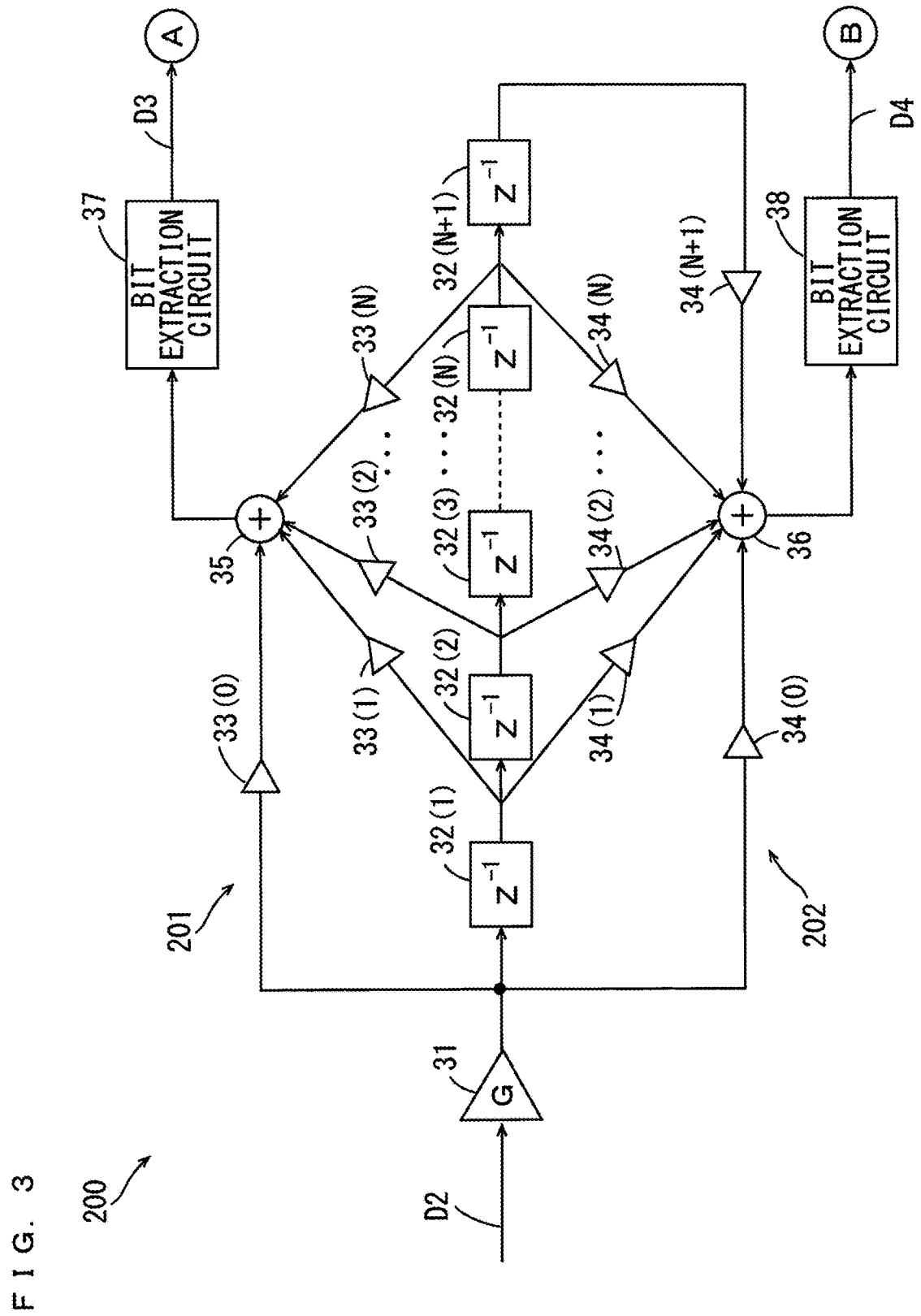
FIG. 3 is a circuit diagram of a filter according to this embodiment.

FIG. 3 is a circuit diagram of the filter 200 according to this embodiment. The filter 200 includes a multiplier 31, the FIR filter 201, the FIR filter 202, a bit extraction circuit 37, and a bit extraction circuit 38. The multiplier 31 multiplies the digital data signal D2 by a multiplication coefficient G. An output of the multiplier 31 is applied to the FIR filter 201 and the FIR filter 202. In a case where the data signal D2 (data signal D1) is a multilevel PAM (Phase Amplitude Modulation) signal, an amplitude of the multilevel PAM signal is adjusted by the multiplication coefficient G of the multiplier 31.

The FIR filter 201 includes N delay units 32(1), 32(2) ... 32(N), a plurality of multipliers 33(0), 33(1) ... 33(N), and an adder 35. That is, the FIR filter 201 is an FIR filter with a tap number N. The FIR filter 202 includes N+1 delay units 32(1), 32(2) ... 32(N), 32(N+1), a plurality of multipliers 34(0), 34(1) ... 34(N), 34(N+1), and an adder 36. That is, the FIR filter 202 is an FIR filter with a tap number N+1. In this way, the FIR filter 201 and the FIR filter 202 share the N delay units 32(1), 32(2) ... 32(N). This makes it possible to reduce a circuit scale of the filter 200.

In the FIR filter 201, the multiplication coefficients of the multipliers 33(0), 33(1) ... 33(N) are set such that a frequency characteristic of the FIR filter 201 is an inverse characteristic of a frequency characteristic of a transmission channel. Similarly, in the FIR filter 202, the multiplication coefficients of the multipliers 34(0), 34(1) ... 34(N), 34(N+1) are set such that a frequency characteristic of the FIR filter 202 is the inverse characteristic of the frequency characteristic of the transmission channel. The multiplication coefficient of each multiplier 33, 34 is set such that the frequency characteristics of the FIR filters 201 and 202 are as approximate as possible.

Moreover, the FIR filter 201 is set such that the multiplication coefficients of the multipliers 33(0), 33(1) ... 33(N) are bilaterally symmetrical or bilaterally antisymmetrical in FIG. 3. That is, if the multiplication coefficients of the multipliers 33(0), 33(1) ... 33(N) are h(0), h(1) ... h(N), the bilateral symmetry refers to a case where the multiplication coefficients are set to h(0)=h(N), h(1)=h(N−1), h(2)=h(N−2) ... (and so on), whereas the bilateral antisymmetry refers to a case where the multiplication coefficients are set to h(0)=−h(N), h(1)=−h(N−1), h(2)=−h(N−2) ... (and so on). Similarly, the FIR filter 202 is set such that the multiplication coefficients of the multipliers 34(0), 34(1) ... 34(N), 34(N+1) are bilaterally symmetrical or bilaterally antisymmetrical in FIG. 3. That is, if the multiplication coefficients of the multipliers 34(0), 34(1) ... 34(N), 34(N+1) are g(0), g(1) ... g(N), g(N+1), the bilateral symmetry refers to a case where the multiplication coefficients are set to g(0)=g(N+1), g(1)=g(N), g(2)=g(N−1) ... (and so on), whereas the bilateral antisymmetry refers to a case where the multiplication coefficients are set to g(0)=−g(N+1), g(1)=−g(N), g(2)=−g(N−1) ... (and so on).

In this way, with the multiplication coefficients of the FIR filter 201 set to be bilaterally symmetrical or bilaterally antisymmetrical, group delay T1 of the FIR filter 201 is T1=(N−1)/2. Also, with the multiplication coefficients of the FIR filter 202 set to be bilaterally symmetrical or bilaterally antisymmetrical, group delay T2 of the FIR filter 202 is T2={(N+1)−1}/2=N/2. Thus, a difference T2−T1 between the group delays of the FIR filters 201, 202 is N/2−(N−1)/

2=½. That is, the data signal output by the FIR filter 202 is a reception data signal that is delayed by 0.5 sample (half a clock) than the data signal output by the FIR filter 201.

With the FIR filter 201 and the FIR filter 202 of this embodiment being configured as above, the FIR filters 201 and 202 can pseudo-sample the received data signal D2 at a sampling rate double that of the analog-to-digital converter 21. Thus, double oversampling in digital processing can be implemented without use of an analog-to-digital converter or the like capable of double oversampling.

The bit extraction circuit 37 extracts upper bits of the data signal output from the FIR filter 201 to generate the data signal D3. For example, the bit extraction circuit 37 extracts upper 3 bits of the data signal output from the FIR filter 201. The bit extraction circuit 38 extracts upper bits of the data signal output from the FIR filter 202 to generate the data signal D4. For example, the bit extraction circuit 38 extracts upper 3 bits of the data signal output from the FIR filter 202. The bit extraction circuit 37 is an example of a "first bit extraction circuit" of the present invention, and the bit extraction circuit 38 is an example of a "second bit extraction circuit" of the present invention. In this embodiment, the multilevel PAM signal is used as the data signal D1 (data signal D2) to be received. The amplitude of the multilevel PAM signal is adjusted by the multiplication coefficient G of the multiplier 31 such that the multilevel PAM signal to be received can be acquired due to the upper bits extracted by the bit extraction circuits 37, 38.

(4) Circuit Configuration of Phase Comparison Circuit

Figure 4:
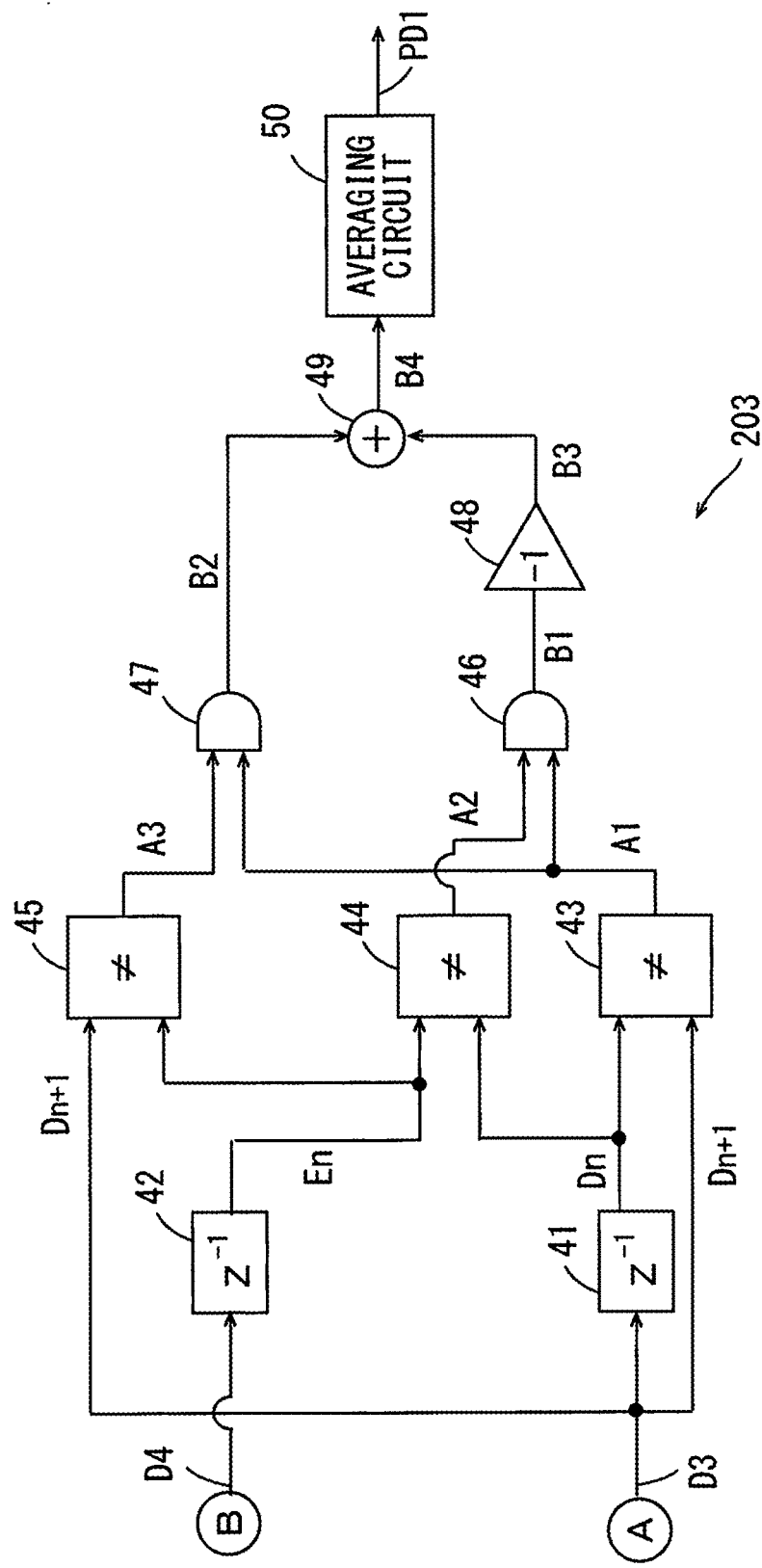
FIG. 4 is a circuit diagram of a phase comparison circuit according to this embodiment.

FIG. 4 is a circuit diagram of the phase comparison circuit 203 according to this embodiment. The phase comparison circuit 203 includes delay units 41, 42, comparison circuits 43, 44, 45, AND circuits 46, 47, an inversion circuit 48, an adder 49, and an averaging circuit 50.

The delay unit 41 inputs the data signal D3 output from the filter 200 (see FIG. 3). The delay unit 42 inputs the data signal D4 output from the filter 200 (see FIG. 3). As described above, the data signal D4 is the reception data signal that is delayed by 0.5 sample (half a clock) compared to the data signal D3. Here, a data signal input to the delay unit 41 is represented by $D_{n+1}$ where a data signal output from the delay unit 41 is $D_n$. The subscript n of the data signal $D_n$ denotes sample timing (clock). Also, a data signal output from the delay unit 42 is represented by $E_n$. Thus, $E_n$ is a signal delayed by 0.5 sample compared to $D_n$, and $D_{n+1}$ is a signal delayed by 0.5 sample compared to $E_n$.

The comparison circuit 43 inputs the data signals $D_n$ and $D_{n+1}$. The comparison circuit 43 compares the data signal $D_n$ with the data signal $D_{n+1}$. The comparison circuit 43 outputs 1 as determination data A1 when the values of these data signals are different from each other, and outputs 0 as the determination data A1 when the values of these data signals are the same. The comparison circuit 44 inputs the data signals $D_n$ and $E_n$. The comparison circuit 44 compares the data signal $D_n$ with the data signal $E_n$. The comparison circuit 44 outputs 1 as determination data A2 when the values of these data signals are different from each other, and outputs 0 as the determination data A2 when the values of these data signals are the same. The comparison circuit 45 inputs the data signals $E_n$ and $D_{n+1}$. The comparison circuit 45 compares the data signal $E_n$ with the data signal $D_{n+1}$. The comparison circuit 45 outputs 1 as determination data A3 when the values of these data signals are different from each other, and outputs 0 as the determination data A3 when the values of these data signals are the same.

Figure 5A:
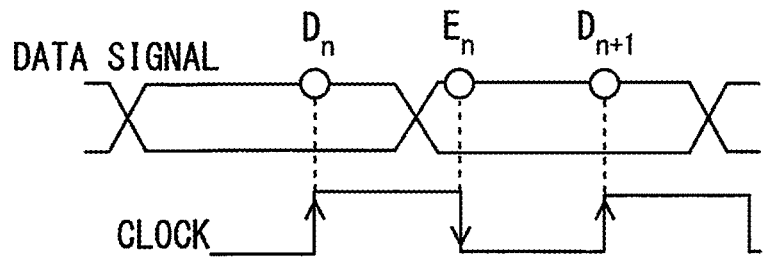
FIGS. 5A and 5B are diagrams showing timing of data signals and a clock signal.
Figure 5B:
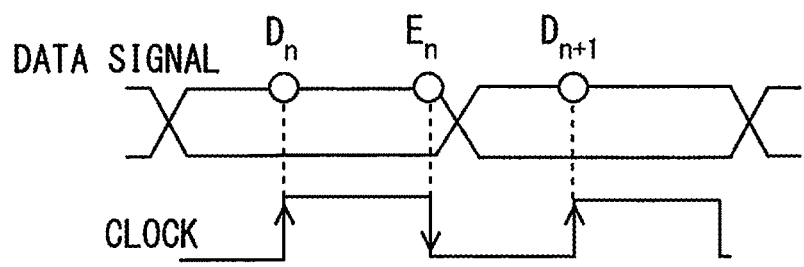
Figure 6A:
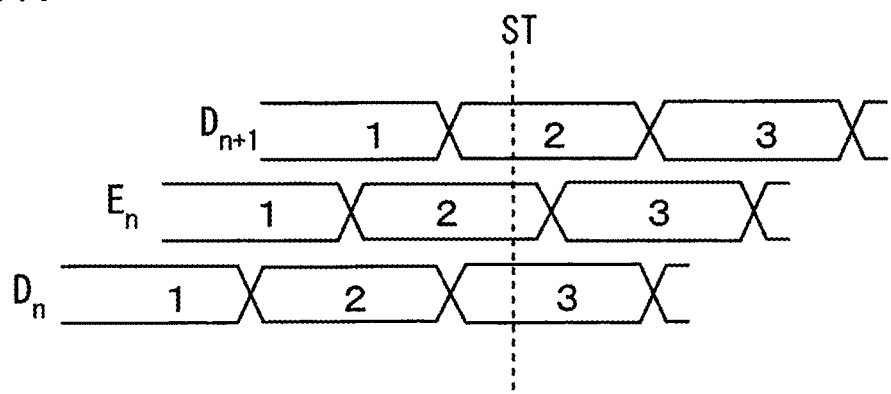
FIGS. 6A and 6B are diagrams showing sample timing of data signals.
Figure 6B:
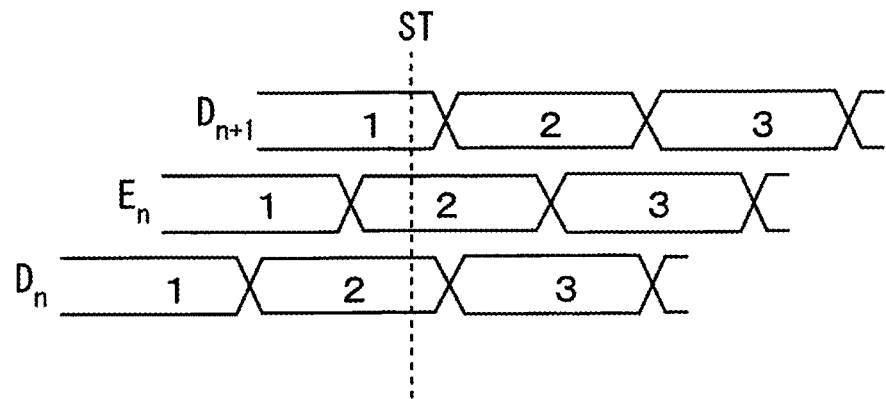

The AND circuit 46 inputs the determination data A1 output from the comparison circuit 43 and the determination data A2 output from the comparison circuit 44. The AND circuit 46 outputs the value 1 as LATE data B1 when both of the values of the determination data A1 and the determination data A2 are 1. The AND circuit 46 outputs the value 0 as the LATE data B1 when either the value of the determination data A1 or the value of the determination data A2 is 0. Here, the determination data A1 represents the value 1 when the data signal $D_n$ and the data signal $D_{n+1}$ are different. The determination data A2 represents the value 1 when the data signal $D_n$ and the data signal $E_n$ are different. FIGS. 5A and 5B are diagrams showing timing of the data signals and a clock signal. In FIG. 5A, the values of the data signal $D_n$ and the data signal $E_n$ are different under the condition that the values of the data signal $D_n$ and the data signal $D_{n+1}$ are different. That is, it indicates a state where the AND circuit 46 outputs the value 1 as the LATE data B1. In other words, it is determined that the phase of the reception clock signal MCL is delayed with respect to the input data signal D1 (data signal D2). FIGS. 6A and 6B are diagrams showing sample timing of the data signals. FIG. 6A shows data signal sequences at the same sample timing as that of FIG. 5A. In FIG. 6A, in a case where the data signals are sampled at sample timing ST, the values of the data signal $D_{n+1}$ and the data signal $E_n$ are the same and the values of the data signal $D_n$ and the data signal $E_n$ are different under the condition that the values of the data signal $D_n$ and the data signal $D_{n+1}$ are different.

The AND circuit 47 inputs the determination data A1 output from the comparison circuit 43 and the determination data A3 output from the comparison circuit 45. The AND circuit 47 outputs the value 1 as EARLY data B2 when both of the values of the determination data A1 and the determination data A3 are 1. The AND circuit 47 outputs the value 0 as the EARLY data B2 when either the value of the determination data A1 or the value of the determination data A3 is 0. Here, the determination data A1 represents the value 1 when the data signal $D_n$ and the data signal $D_{n+1}$ are different. The determination data A3 represents the value 1 when the data signal $D_{n+1}$ and the data signal $E_n$ are different. In FIG. 5B, the values of the data signal $D_{n+1}$ and the data signal $E_n$ are different under the condition that the values of the data signal $D_n$ and the data signal $D_{n+1}$ are different. That is, it indicates a state where the AND circuit 47 outputs the value 1 as the EARY data B2. In other words, it is determined that the phase of the reception clock signal MCL is advanced with respect to the input data signal D1 (data signal D2). FIG. 6B shows data signal sequences at the same sample timing as that of FIG. 5B. In FIG. 6B, in a case where the data signals are sampled at the sample timing ST, the values of the data signal $D_{n+1}$ and the data signal $E_n$ are different and the values of the data signal $D_n$ and the data signal $E_n$ are the same under the condition that the values of the data signal $D_n$ and the data signal $D_{n+1}$ are different.

The inversion circuit 48 multiplies the LATE data B1 output from the AND circuit 46 by −1 to output LATE data B3 in which the sign of the LATE data B1 is inverted. The adder 49 inputs the LATE data B3 output from the inversion circuit 48 and the EARLY data B2 output from the AND circuit 47 to add these data. That is, in the adder 49, −1 is added as the LATE data B3 in a case were the phase of the reception clock signal MCL is delayed with respect to the input data signal D1 (data signal D2). In the adder 49, 1 is added as the EARLY data B2 in a case where the phase of the reception clock signal MCL is advanced with respect to the input data signal D1 (data signal D2). The adder 49 applies values of results of the addition of the LATE data B3 and the EARLY data B2 to the averaging circuit 50. The averaging circuit 50 stores the values of the addition results input from the adder 49 by predetermined samples to calculate an average value thereof. The averaging circuit 50 outputs the calculated average value as phase difference data PD1. The phase difference data PD1 is data that evaluates a phase difference between the received digital data signal D2 and the reception clock signal MCL, i.e., a phase difference between the reference clock signal generated by the transmitter 1 and the reference clock signal BCL generated by the receiver 2.

When the LATE data B3 and the EARLY data B2 are correctly obtained in the phase comparison circuit 203, the adder 49 outputs the value −1 or the value +1. However, in a case where the received data signal D1 is the 4-level PAM signal, for example, the LATE data B3 may be the value −1 and the EARLY data B2 may be the value +1 due to erroneous determination. However, even in such a case, these values are added to obtain 0 in the adder 49 and, therefore, unnecessary variation of the output of the phase comparison circuit 203 due to the erroneous determination is inhibited. Also, even in a case where the LATE data B3 and the EARLY data B2 alternately output the value −1 and the value +1, the values are averaged by the averaging circuit 50 and, therefore, unnecessary variation of the output of the phase comparison circuit 203 is inhibited. It is noted that the averaging circuit 50 is not indispensable in the phase comparison circuit 203, and the phase comparison circuit 203 may also be configured to exclude the averaging circuit 50.

Figure 7:
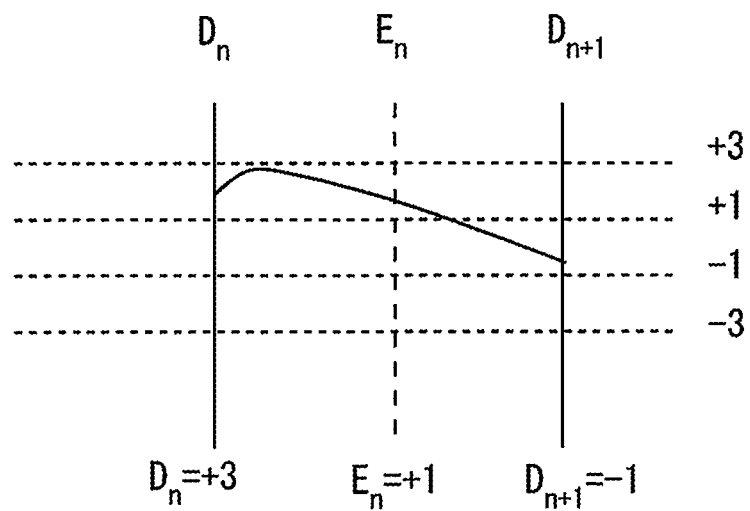
FIG. 7 is a diagram showing sample timing of a 4-level PAM signal.

FIG. 7 shows an example in a case where the received data signal D2 (data signal D1) is the 4-level PAM signal. The data signal D2 is the 4-level PAM signal and therefore indicates any of values −3, −1, +1, +3. The example of FIG. 7 shows a case where the data signal $D_n$ is +3 and the data signal $D_{n+1}$ is −1. At this time, the data signal $E_n$ delayed by half a clock is determined as the value +1 in the course of transition from the data signal $D_n$ to the data signal $D_{n+1}$. In such a case, the LATE data B3 indicates the value −1, and the EARLY data B2 indicates the value +1. However, these values are added by the addition performed by the adder 49 and not evaluated as a phase difference. Alternatively, even in a case where either one of the LATE data B3 and the EARLY data B2 indicates the value 0, and the other outputs the value +1 or −1 by erroneous determination, these values are averaged in the averaging circuit 50 or the loop filter 204. Therefore, no significant influence is exerted on generation of the phase data D2. Also, in a case where a scrambler is applied such that the data signal transmitted by the transmitter 1 becomes close to a uniform random number, probability of erroneous determination by the LATE data B3 and the EARLY data B2 becomes uniform. Thus, the averaging can remove the influence of the erroneously determined LATE data B3 and EARLY data B2.

(5) Operation of Loop Filter and Phase Interpolation Circuit

FIG. 2 is referred to. The loop filter 204 inputs the phase difference data PD1 output from the phase comparison circuit 203. The loop filter 204 includes the averaging circuit and the integrating circuit. The loop filter 204 performs the averaging processing on the phase difference data PD1 to integrate the phase difference data PD1 subjected to the averaging processing. Thus, the loop filter 204 generates the phase data PD2.

The phase interpolation circuit 205 inputs the phase data PD2 output from the loop filter 204. The phase interpolation circuit 205 also inputs the reference clock signal BCL output from the reference clock generation circuit 22. The phase interpolation circuit 205 adjusts the phase of the reference clock signal BCL based on the phase data PD2 to generate the reception clock signal MCL. The phase interpolation circuit 205 supplies the reception clock signal MCL to the analog-to-digital converter 21. Thus, the analog-to-digital converter 21 samples the received analog data signal D1 based on the reception clock signal MCL whose phase is adjusted.

(6) Other Embodiments

In the above-described embodiment, in the filter 200, the FIR filter 201 and the FIR filter 202 are configured to share the delay units 32(1), 32(2) . . . 32(N). As an embodiment other than the above-described embodiment, the FIR filter 201 and the FIR filter 202 may be configured to each include delay units. In order to reduce the circuit scale, the FIR filter 201 and the FIR filter 202 desirably share the delay units 32(1), 32(2) . . . 32(N).

In the above-described embodiment, in the FIR filter 201 and the FIR filter 202, the multiplication coefficients of the multipliers are set such that the frequency characteristic of each FIR filter is the inverse characteristic of the transmission channel. As an embodiment other than the above-described embodiment, a filter for adjusting the frequency characteristic may be provided separately from the FIR filter 201 and the FIR filter 202.

(7) Aspects of Present Invention

<1> As has been described above, the clock and data recovery circuit 23 according to this embodiment includes the phase interpolation circuit 205 that adjusts the phase of the reference clock signal BCL generated by the reference clock generation circuit 22 to generate the reception clock signal MCL, the filter 200 that inputs the reception digital data signal D2 output from the analog-to-digital converter 21 that operates in synchronization with the reception clock signal MCL generated in the phase interpolation circuit 205 to convert the reception analog data signal D1 to the reception digital data signal D2, to perform filter processing on the reception digital data signal D2, the phase comparison circuit 203 that outputs the phase difference data PD1 between the transmission-side clock signal and the reference clock signal BCL based on the signals D3, D4 output from the filter 200, and the loop filter 204 that generates the phase data PD2 to be set in the phase interpolation circuit 205 based on the phase difference data PD1 output from the phase comparison circuit 203, wherein the filter 200 includes the FIR filter 201 with a tap number of N (N is a positive integer), and the FIR filter 202 with a tap number of N+1 that outputs the signal delayed by half a clock than the first FIR filter 201. This makes it possible to implement double oversampling in digital processing without use of an analog-to-digital converter or the like capable of double sampling.

<2> The FIR filter 201 and the FIR filter 202 may share the delay units 32(1), 32(2) . . . 32(N) constituting the FIR filter 201 and the FIR filter 202. Thus, the circuit scale of the filter 200 can be reduced.

<3> The filter 200 may include the bit extraction circuit 37 that extracts predetermined upper bits of the output of the FIR filter 201 and the bit extraction circuit 38 that extracts predetermined upper bits of the output of the FIR filter 202. With use of the upper bits, a calculation amount of the clock and data recovery circuit can be reduced.

<4> Filter coefficients of the FIR filter 201 and the FIR filter 202 may be set such that the FIR filters 201 and 202 have the inverse characteristic of the frequency characteristic of the transmission channel. The frequency characteristic of the reception data signal can also be adjusted in the filter 200.

The receiver 2 according to this embodiment includes the clock and data recovery circuit 23, the reference clock generation circuit 22, and the analog-to-digital converter 21 as described in any of the above-mentioned sections <1> to <4>.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

I claim:

1. A clock and data recovery circuit comprising:
a phase interpolation circuit that adjusts a phase of a reference clock signal generated by a reference clock generation circuit to generate a reception clock signal;
a filter that inputs a reception digital data signal output from an analog-to-digital converter that operates in synchronization with the reception clock signal generated in the phase interpolation circuit to convert a reception analog data signal to the reception digital data signal, to perform filter processing on the reception digital data signal;
a phase comparison circuit that outputs phase difference data between a transmission-side clock signal and the reference clock signal based on a signal output from the filter; and
a loop filter that generates phase data to be set in the phase interpolation circuit based on the phase difference data output from the phase comparison circuit,
wherein the filter includes
a first FIR filter with a tap number N, and
a second FIR filter with a tap number N+1 that outputs a signal delayed by half a clock than the first FIR filter.

2. The clock and data recovery circuit according to claim 1, wherein the first FIR filter and the second FIR filter share a delay unit constituting the first FIR filter and the second FIR filter.

3. The clock and data recovery circuit according to claim 1, wherein the filter includes
a first bit extraction circuit that extracts predetermined upper bits of an output of the first FIR filter, and
a second bit extraction circuit that extracts predetermined upper bits of an output of the second FIR filter.

4. The clock and data recovery circuit according to claim 1, wherein filter coefficients of the first FIR filter and the second FIR filter are set such that the first FIR filter and the second FIR filter each have an inverse characteristic of a frequency characteristic of a transmission channel.

5. A receiver comprising:
the clock and data recovery circuit according to claim 1;
the reference clock generation circuit; and
the analog-to-digital converter.

* * * * *